United States Patent [19]

Fry

[11] Patent Number: 4,812,848
[45] Date of Patent: Mar. 14, 1989

[54] ANALOG TO DIGITAL CONVERSION

[75] Inventor: John J. Fry, Wickliffe, Ohio

[73] Assignee: The Babcock & Wilcox Company, New Orleans, La.

[21] Appl. No.: 92,115

[22] Filed: Sep. 2, 1987

[51] Int. Cl.$^4$ .............................................. H03M 1/60
[52] U.S. Cl. .................................... 341/157; 341/124
[58] Field of Search ................. 340/347 AD, 347 NT; 341/124, 157

[56] References Cited

U.S. PATENT DOCUMENTS 4,521,763  6/1985  Murao et al. ................ 340/347 AD
4,558,301  12/1985  Trofimenkoff et al. ..... 340/347 AD Primary Examiner—William M. Shoop, Jr.
Assistant Examiner—Marc S. Hoff
Attorney, Agent, or Firm—Vytas R. Matas; Robert J. Edwards

[57] ABSTRACT

A method and apparatus of converting analog voltage signals to digital frequency signals comprises a voltage to frequency converter having an output which produces pulse trains that are proportional to the voltage level of an analog voltage signal applied to the converter. A microprocessor is connected to the converter for sampling the pulse trains during a fixed sampling period. The microprocessor detects the leading edges of the first and last pulse in the pulse train, stores the occurrence time for the two leading edges and then subtracts the occurrence times to calculate the duration time for all the pulses in the sample period between the leading edges of the first and last pulses. A counter counts the number of pulses between the first and last pulse, and a calculation is made dividing the number of pulses by the time duration to yield an accurate measurement of the frequency for the pulse train. A precision reference voltage along with a plurality of analog voltage signals to be measured, is applied to the plural inputs of a multiplexer. The output of the multiplexer is then amplified and a level shifted before it is applied to the converter. The microprocessor drives the multiplexer to sequentially apply signals to the converter. During each complete cycle of the multiplexer the microprocessor receives a pulse train corresponding to the reference voltage signal. A stored frequency for that reference pulse train is then compared to the actual frequency which results from the reference voltage to determine whether any shifts in ambient conditions have caused shifts in the output of the converter. This shift is interpreted as being caused by changes in ambient condition and is applied equally to all other measured frequencies. In this way, inexpensive components can be used while still maintaining accuracy for a wide range of ambient conditions.

11 Claims, 4 Drawing Sheets $$f = \frac{N}{T}$$

$$f = \frac{N}{t_1 - t_2}$$

$$f = \frac{N}{t_L - t_F}$$

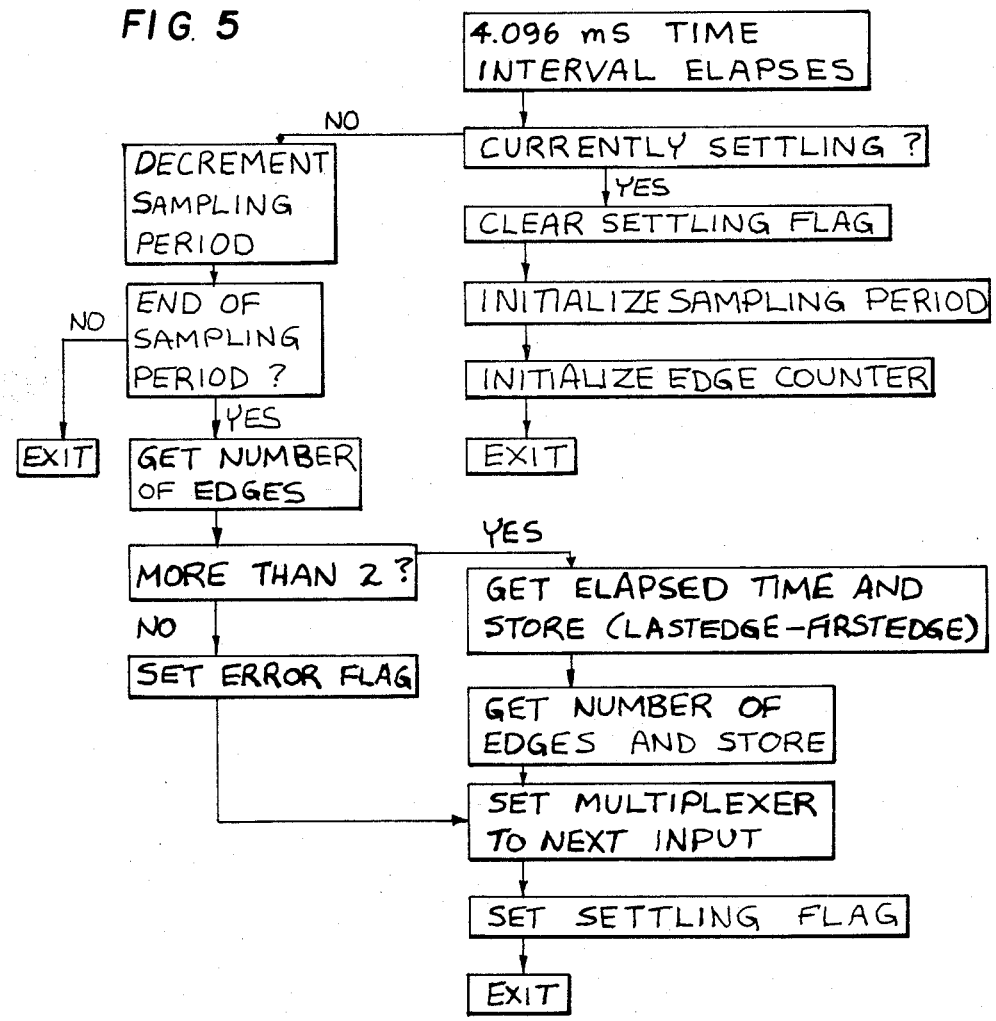

4,812,848

ANALOG TO DIGITAL CONVERSION

FIELD AND BACKGROUND OF THE INVENTION

The present invention relates in general to analog to digital converters, and in particular, to a new and useful analog to digital converter which utilizes the output of a frequency to digital converter to accurately and inexpensively convert analog signals into digital signals.

Microprocessor based digital systems are often used as part of process control and data collection equipment. In these systems, it is necessary to convert analog signals from the process to digital information which can be manipulated by the microprocessor. One of the more common methods is to use a multiplexer which is controlled by the microprocessor to pick an analog signal to be sent to a signal conditioner. This signal conditioner increases or decreases the signal level to that level needed by an analog to digital converter chip. This chip is used to convert the analog signal at its input into a digital number whose value is directly proportional to the voltage at its input. This chip tends to be expensive and the degree of resolution, that is the largest increment of the analog signal that can be converted into a single digital number, is dependent on the chip. In other words, if a lower analog signal level must be resolved, then the signal conditioner will have to increase the signal level to the input of the analog to digital converter chip. In this case, the firmware, that is, programs that tell the microprocessor how to read this digital number and which signal input the microprocessor is looking at, could not increase the resolution.

Two other types of analog to digital converters use a multiplexer with signal conditioning and a voltage to frequency converter. The microprocessor tells the multiplexer which analog signal to pick up and a direct frequency is read by the microprocessor during that time period. The first of these converters counts the number of pulses during a set time as shown in FIG. 1. The pulse count is divided by the time period to give the frequency. A problem associated with this method is that a time segment before the first pulse (tl) and after the last pulse (t2) cause an error in the time period. The lower the frequency the worse this error gets. If a large number of these periods are averaged together this error will decrease, but the microprocessor spends more time looking at its inputs. The maximum frequency can be raised to compensate for this error. The more pulses in the time period, the smaller times (tl) and (t2) become which cause less error in the period. This, however, has the same effect as where the processor spends too much time looking at the inputs and not doing anything else.

The second method, shown in FIG. 2, is also sometimes used. In this method, the first pulse time is noted, the last pulse time is noted and the number of pulses in between are counted.

The period is defined by the last pulse time minus the first pulse time. The total count of pulses is divided by the time period resulting in the frequency of the signal input This method has two problems. It is desirable to use a period of 16.67 milliseconds because at 16.67 milliseconds the noise associated with AC power lines is filtered out. The period used by this method, however, varies and is not set. Because of the variable period, the firmware routines are harder to design and the processor is again spending too much time looking at its inputs.

U.S. Pat. No. 4,016,557 to Zitelli et al discloses an analog system including a multiplexer which selectively extends analog signals representing plural process variables to an analog to digital (A/D) converter. The A/D converter converts each input analog signal into a digital representation in the form of a pulse count corresponding to the amplitude of the analog signal. This reference uses a variable gain approach where the system must be calibrated for each gain. There is no disclosure containing details of the A/D converter.

U.S. Pat. No. 4,086,656 to Brown discloses an analog to digital integrator which uses a voltage to pulse frequency converter. This reference does not treat problems associated with a loss of resolution nor does it utilize a multiplexer. While the use of different reference voltages is disclosed, there is no teaching on how the effects on accuracy of an external multiplexer would be compensated for.

U.S. Pat. No. 4,118,696 to Warther discloses an A/D converter employing a precision reference voltage. The circuits of the converter include a voltage/frequency oscillator which generates a pulse train corresponding to the input of an analog signal applied thereto. Although the number of pulses within a fixed time period is counted, the time period between first and last pulses is not taken nor is a multiplexer or microprocessor utilized. The errors illustrated in FIG. 1 of the present application would thus occur in this reference.

U.S. Pat. No. 4,309,767 to Andow et al discloses a monitoring system including a multiplexer and A/D converter which apply signals to a digital processing system. There is no teaching concerning how the A/D conversion is conducted within the converter.

U.S. Pat. No. 4,527,148 to Kuboki et al discloses an analog to digital converter in which analog signals are multiplexed, and converted to digital form for processing by a microprocessor. The analog circuits do not, however, employ a voltage to frequency conversion operation.

U.S. Pat. No. 4,547,724 to Beazley et al discloses multiplexing using a three position switch for applying three different voltages to a voltage to frequency converter. No mention is made concerning the resolution problem or any solution to that problem.

SUMMARY OF THE INVENTION

The present invention is drawn to an improved analog to digital conversion method and apparatus which utilizes a voltage to frequency converter, a conditioner for amplifying and shifting analog voltage signals received from a process to the level where they are acceptable for the converter, a microprocessor for sampling pulse trains from the converter, and a multiplexer having plural inputs for different analog signals to be measured as well as an input for a precision reference voltage and for a ground or zero reference voltage. The inventive method and apparatus can measure analog voltage signals of between zero and 100 mV and higher. Voltage ranges from −20 mV to 150 mV can accurately be measured in accordance with the invention.

These diverse voltages are accurately converted to digital signals in the form of frequency values for pulse trains from the converter. This is accomplished without the use of variable analog gain stages and, at the same time, by utilizing a sampling period having a fixed duration which is preferably selected to be near the value of 16.67 milliseconds which is the level at which AC power line noise is most advantageously filtered out.

The microprocessor utilizes a fixed settling period between each sampling period to provide enough time for the operation of the microprocessor as well as settling the frequency of the pulse train from the converter.

Accordingly, an object of the present invention is to provide a method and apparatus of converting an analog voltage signal to a digital signal comprising applying the voltage signal to the input of a voltage to frequency converter which outputs a pulse train having pulses at a frequency which is a function of the voltage level of the voltage signal, sampling the pulse train during a fixed sampling period having a duration containing at least a plurality of pulses, detecting the leading edges of first and last pulse occurring during the sampling period, calculating the time duration between the first and last pulses, counting the number of pulses between the first and last pulse and dividing this number by the duration time to give an accurate measurement of the frequency for the pulse train. The analog voltage signals are applied by a multiplexer which also has one input for receiving a precision reference voltage which, under ambient conditions, outputs a reference pulse train from the converter. The frequency of the reference pulse train is stored and compared to pulse trains coming from the converter as a result of the precision reference voltage but under unknown ambient conditions. A shift in frequency represents a change in ambient conditions. This shift can be applied equally to all measured frequencies to account for the changes in ambient conditions.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the accompanying drawings, forming a part of this specification, and in which reference numerals shown in the drawings designate like or corresponding parts throughout the same

FIG 5 is a flow chart illustrating the method of the present invention;

DESCRIPTION OF THE PREFERRED EMBODIMENT

Figure 3:
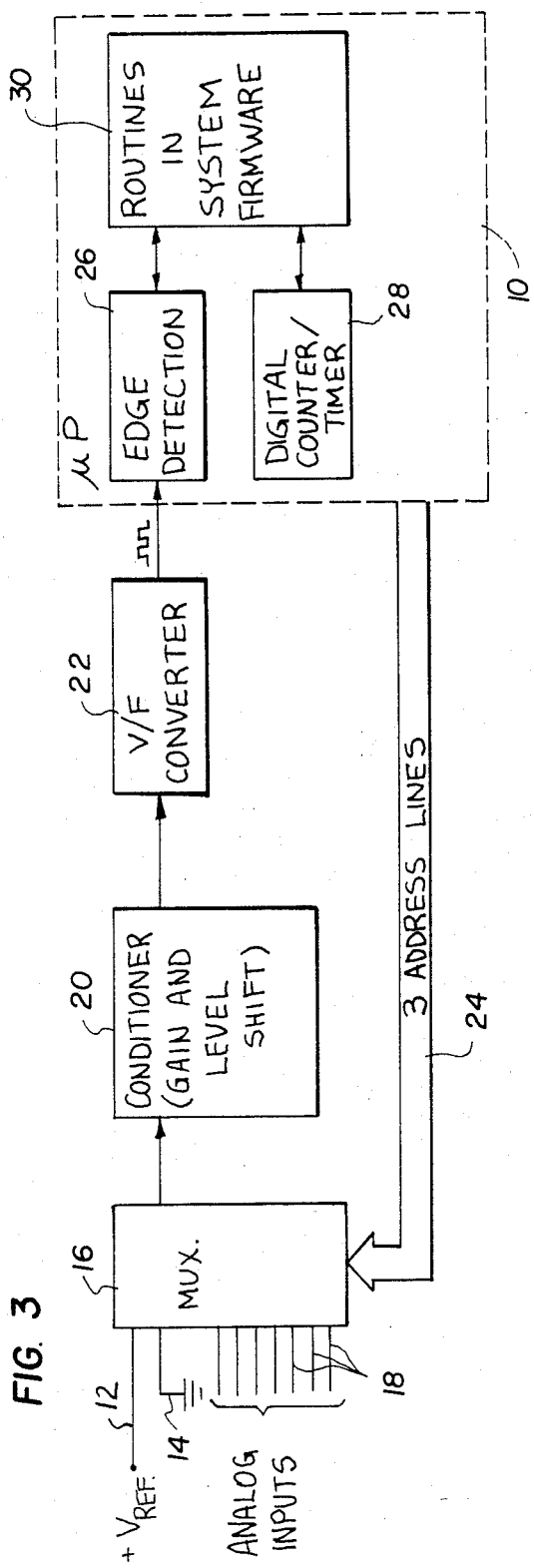
FIG. 3 is a block diagram showing the apparatus of the present invention.

Referring to the drawings in particular, the invention embodied in FIG. 3 comprises an apparatus and method for converting analog signals which can be applied at inputs 18 to a multiplexer 16 into digital signals in the form of frequency values calculated by a microprocessor 10.

As shown in FIG. 3, the inventive method uses a precision reference voltage 12 of known value and low drift for changes in ambient conditions. The reference voltage 12 and a signal common or ground 14 are applied to two of the eight signal inputs to the multiplexer 16. The remaining six inputs 18 of the multiplexer 16 receive analog signals for the converter. The eight signals are sequenced thru the multiplexer one at a time, the system firmware deciding the order. The selected signal then goes thru a signal conditioner 20 and voltage to frequency converter 22. The microprocessor 10 monitors the frequency input from the voltage to frequency converter 22. The precision reference voltage 12 and signal common 14 are monitored as a signal input and their respective theoretical values are known to the microprocessor. Effects of ambient temperature, drift of signal conditioning and frequency shift of the voltage to frequency converter, can all be compensated for by the system firmware.

Figure 1:
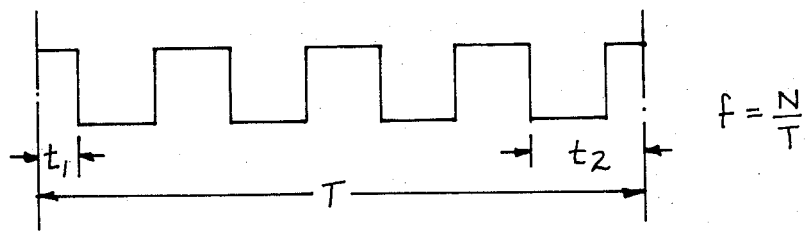
FIG. 1 is a pulse train diagram illustrating one prior art approach for measuring frequency of a voltage to frequency converter.
Figure 2:
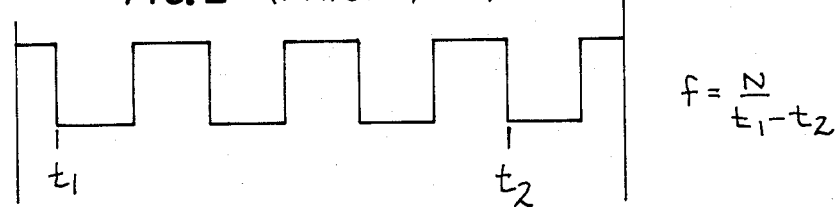
FIG. 2 is a view similar to FIG. 1, illustrating another prior art approach.
Figure 4:
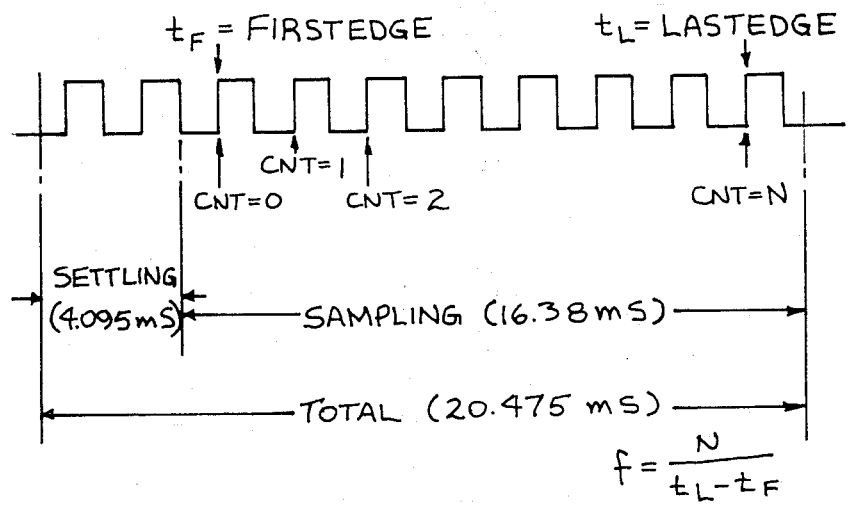
FIG. 4 is a pulse train diagram showing fixed, settling and sampling periods used in accordance with the present invention.

The firmware's signal input routine uses a fixed period which includes settling time for the hardware and a fixed sampling period of approximately 16.38 milliseconds as shown in FIG. 4. This sampling time is close to 16.67 milliseconds to filter out AC power line noise. The time of the first leading edge is noted and the time of the last leading edge is noted, along with the pulse count in between. The time period is defined by the last leading edge time subtracted from the first leading edge time. The total count of pulses is divided by the time period which gives the frequency that is monitored by the microprocessor. By using the inventive method, the following can be accomplished:

(1) Multiplexing is easy because the sampling period is fixed;
(2) No resolution is lost because the time of the first and last leading edges are used in the period calculation; and
(3) AC power line noise is filtered by choosing the sampling period.

Since the voltage to frequency converter is a single input to the microprocessor 10, unlike some prior art methods where the analog to digital converter has multiple inputs, ground isolation is easier to achieve. In other words, each line of the analog to digital converter has to be isolated in the prior art, where only one has to be isolated in the voltage to frequency converter. The inventive method thus costs less.

A voltage to frequency converter which can be used as converter 22 is available from National Semiconductor and is referred to as the model LM331A. The conditioner 20 amplifies and shifts the signal on the output of multiplexer 16 from the millivolt range of the analog voltage signals up to the range which is compatible for the converter 22.

Also, in accordance with the present invention, rather than re-calibrating the converter for a diverse range of analog voltage signals by using zero and span adjustment values, which is conventional for this type of converter, the periodic application of the precision reference voltage 12 and the zero voltage 14 to the converter is used for producing reference pulse trains on its output. These reference pulse trains, under known conditions for the entire system, have known frequency values which are stored in the microprocessor and compared to the actual frequency of the reference pulse trains. Any shift in frequency represents a change in ambient conditions. This shift can then be applied to the calculated frequencies for all the analog voltage signals to be converted. The system thus takes account of the overall ambient effect without regard to the absolute frequency output of the converter. Microprocessor 10 contains detecting means in the forms of an edge detection unit 26 and counting means 28. These are interconnected to each other and with memories 30 containing routines for the system firmware.

Figure 6:
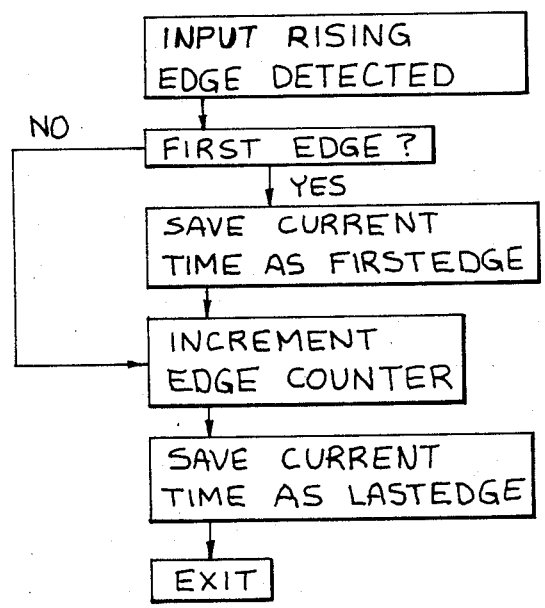
FIG. 6 is a flow chart illustrating part of the method of the present invention.

FIGS. 5 and 6 are flow charts showing the operating of the microprocessor.

The microprocessor operates with a real time interrupt which occurs regularly at 4.095 ms intervals. This interval is a function of the microprocessor used in the system. This provides the basic minimum time period used in the control of the system. The sampling cycle for a given input is shown in FIG. 4. The sampling period of 16.38 ms is selected so that it is close to the value 16.67 ms where AC power line noise is filtered out.

Figure 7:
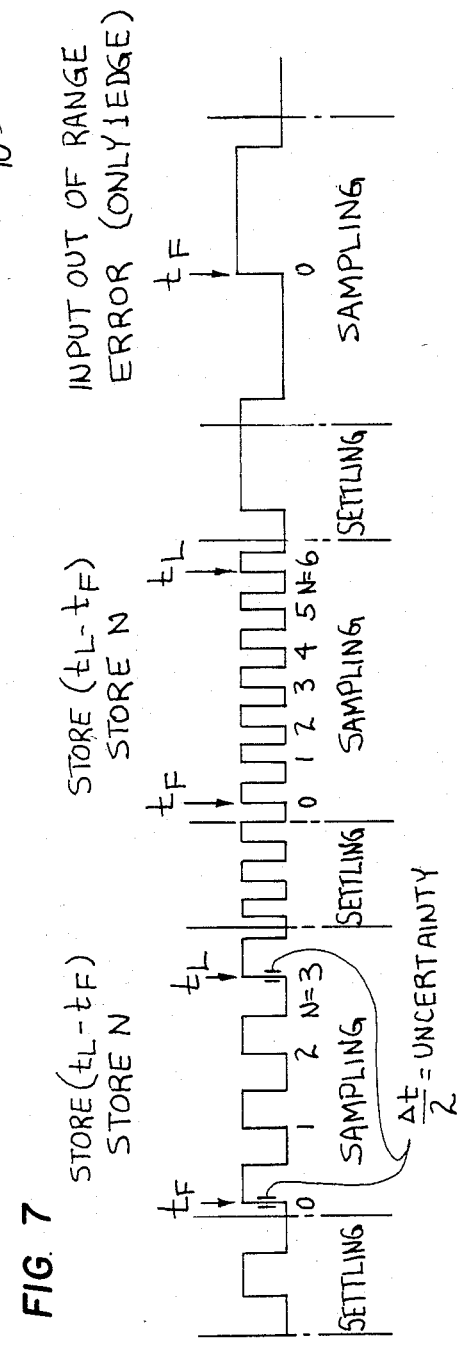
FIG. 7 is a pulse train diagram showing the analog to digital conversion for a plurality of signals sampled during a sequence of sampling periods.

The settling time allows the conditioner 20 and the converter 22 to reach their final values before the converter output is sampled. If the system has been settling, the settling sequences terminated and initialization for the sampling period is completed. If the system has not been settling, it has been sampling, and the current time within the sampling period is determined. If the sampling period is now over, the number of rising or leading edges must be checked. Since one complete period of the input must be sampled to determine the input frequency, two rising or leading edges must be detected. Otherwise, an error occurs and is flagged. FIG. 7 illustrates a plurality of sampling periods each separated by a settling period. The last sampling period indicates an error where less than two complete pulses occurred within the sampling period. This indicates that the analog voltage signal is out of the measuring range for the apparatus.

If one complete period of the input signal has been detected, the elapsed time between the first and last leading edges, as well as the number of edges, are detected and saved in the microprocessor. These values are used to determine the input frequency which is done by simply dividing the number of pulses between the first and last pulse, by the time duration between the leading edges of the first and last pulse.

FIG. 7 also illustrates the resolution of the present invention, that is, the accuracy with which the frequency is measured.

The input resolution of the system is entirely dependent on the certainty of the time measurement taken for the occurrence time of the leading edges for the first and last pulses ($t_L$). The exact time at which intermediate edges occur (if any do in fact occur) has no effect. This results in an averaging of the input frequency over the sampling period. The uncertainty of the frequency being measured is:

$$\text{UNCERTAINTY} = \frac{N}{T + \Delta t} - \frac{N}{T} = \frac{N\Delta t}{T^2 + T\Delta t} = \frac{1}{T}$$

Where

N = of pulses

T = total sampling.

t = total uncertainty in time measurement (including uncertainty in measurement for first edge and last edge).

The method and apparatus of the present invention have several advantages over the prior art. First, because the input uncertainty is inversely proportional to the sample time, the resolution can be increased by increasing the sampling time. In the present invention, this can be achieved by initializing the sampling period to different lengths. This requires no additional hardware and is especially useful in systems where sampling speed is not important.

Secondly, because the logic for determining the sample period is tied to a fixed real time interrupt interval, the edge counting routine is simplified. This reduces cost in service.

In addition, the use of a reference zero and precision reference voltage allows component tolerances and drifts due to changing ambient conditions to be neglected.

While a specific embodiment of the invention has been showed and described in detail to illustrate the application of the principals of the invention, it will be understood that the invention may be embodied otherwise without departing from such principals.

The invention claimed is:

1. A method of converting an analog voltage signal to a digital signal, comprising:
    applying the voltage signal to the input of a voltage to frequency converter which outputs a pulse train having pulses at a frequency which is a function of the voltage level of the voltage signal;
    sampling the pulse train during a fixed sampling period having a duration containing at least a plurality of pulses of the pulse train and being sufficiently close to the peak period for filtering AC power line noise to still provide such filtering;
    detecting the leading edge of a first pulse of the pulse train in the sampling period;
    storing the occurrence time of the leading edge of the first pulse;
    detecting the leading edge of a last pulse of the pulse train in the sampling period;
    storing the occurrence time of the leading edge of the last pulse;
    counting the number of pulses in the sampling period between the occurrence times;
    calculating the difference between the occurrence times as a measurement of the time duration for the counted number of pulses; and
    dividing the counted number of pulses by the time duration for the counted number of pulses as a measurement of the frequency of the pulse train, the frequency of the pulse train comprising a digital signal which is a function of the voltage signal.

2. A method according to claim 1 wherein said peak period is 16.67 milliseconds and the fixed sampling period is selected to be close enough to 16.67 milliseconds to filter out AC power line noise.

3. A method according to claim 1 including storing the occurrence times, counting the pulses, calculating the difference between the occurrence time and dividing the counted pulses by the time duration in a microprocessor, applying a plurality of voltage signals to a plurality of inputs of a multiplexer having one output, controlling the multiplexer using the microprocessor to sequentially select one voltage at a time for application to the multiplexer output, connecting the multiplexer output to the voltage to frequency converter for outputting a sequence of pulse trains each corresponding to one of the voltage signals, repeating the sampling for each pulse train, and separating each fixed sampling period by a fixed settling period.

4. A method according to claim 3 including applying to one of the multiplexer inputs, a selected precision reference voltage signal, the voltage to frequency converter when receiving said reference voltage signal under known ambient conditions outputting a pulse train with a known frequency, storing the known frequency in the microprocessor, comparing the stored known frequency to a measured frequency of an outputted pulse train from the voltage to frequency converter resulting from the reference voltage signal when the voltage to frequency converter is under unknown ambient conditions to measure a shift in frequency, and using the shift in frequency to shift all measured frequencies.

5. A method according to claim 3 including shifting and amplifying the signal from the multiplexer before it is applied to the voltage to frequency converter.

6. A method according to claim 2 wherein the sampling period is approximately 16.38 milliseconds.

7. An apparatus for converting an analog voltage signal to a digital signal comprising:
 a voltage to frequency converter having an input for receiving an analog voltage signal and an output for outputting a pulse train having pulses at a frequency which is a function of the voltage level of the voltage signal;
 sampling means connected to said converter output for sampling pulse trains during a fixed sampling period which has a duration containing a plurality of pulses of the pulse train and which is close enough to the peak period for providing AC power line noise filtering to provide such filtering;
 detecting means connected to said sampling means for detecting the leading edge of a first pulse of the pulse train during the sampling period, the leading edge of a last pulse of the pulse train during the sampling period, and the time of occurrence for the leading edges of the first and last pulses;
 counting means operatively connected to said detecting means for counting the number of pulses between the first and last pulses detected during the sampling period; and
 calculating means operatively connected to said detecting means and to said counting means for calculating the time duration between the occurrence times of the leading edges of the first and last pulses, and for dividing the number of pulses from counting means by the time duration as a measurement of the pulse train frequency, the pulse train frequency comprising a digital signal.

8. An apparatus according to claim 7 wherein said sampling period is selected to be approximately 16.38 milliseconds which is close enough to the 16.67 milliseconds peak sampling period to still provide AC power line filtering.

9. An apparatus according to claim 7 including a multiplexer having a first input for receiving a precision reference voltage, and a plurality of further inputs each for receiving a different analog voltage signal, said multiplexer having an output at which said reference voltage and said analog voltage signals sequentially appear, said output being connected to said converter input, said converter producing a reference pulse train when receiving said reference voltage having a known frequency at known ambient conditions, and comparing means for comparing the known frequency of the reference pulse train to the frequency of pulse trains from said converter resulting from said reference voltage at unknown ambient conditions for said converter to measure a shift which is due to a change in ambient conditions, and applying said shift to the calculation of frequencies for the analog signals.

10. An apparatus according to claim 9 including conditioning means connected between said multiplexer and said converter for amplifying and shifting the voltage of signals from said multiplexer to an acceptable input level for said converter.

11. An apparatus according to claim 10 including a microprocessor containing said sampling, detecting, counting, calculating and comparing means, said microprocessor being connected to said multiplexer for shifting inputs of said multiplexer for application to the output thereof, said sampling means repeatedly sampling said output of said converter with a fixed settling time delay between samplings.

* * * * *